United States Patent
Kuo et al.

(10) Patent No.: US 8,836,390 B2
(45) Date of Patent: Sep. 16, 2014

(54) PHASE-LOCKED LOOPS THAT SHARE A LOOP FILTER AND FREQUENCY DIVIDER

(71) Applicant: Taiwan Semiconductor Manufacturing Company, Ltd., Hsinchu (TW)

(72) Inventors: Feng Wei Kuo, Zhudong Township (TW); Shyh-An Chi, Hsinchu (TW); Huan-Neng Chen, Taichung (TW); Yen-Jen Chen, Taipei (TW); Chewn-Pu Jou, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/038,970

(22) Filed: Sep. 27, 2013

(65) Prior Publication Data
US 2014/0021989 A1 Jan. 23, 2014

Related U.S. Application Data

(63) Continuation-in-part of application No. 13/407,394, filed on Feb. 28, 2012, now Pat. No. 8,547,151.

(60) Provisional application No. 61/565,271, filed on Nov. 30, 2011.

(51) Int. Cl.
*H03L 7/06* (2006.01)
*H03L 7/07* (2006.01)
*H03L 7/093* (2006.01)
*H03L 7/099* (2006.01)

(52) U.S. Cl.
CPC .. *H03L 7/06* (2013.01); *H03L 7/07* (2013.01); *H03L 7/093* (2013.01); *H03L 7/099* (2013.01)
USPC .......................................... 327/157; 327/148

(58) Field of Classification Search
None
See application file for complete search history.

(56) References Cited

U.S. PATENT DOCUMENTS

| | | | |
|---|---|---|---|
| 5,977,806 A | 11/1999 | Kikuchi | |
| 6,201,448 B1 | 3/2001 | Tam et al. | |
| 6,670,833 B2 * | 12/2003 | Kurd et al. | 327/156 |
| 7,138,877 B2 * | 11/2006 | Vu et al. | 331/2 |
| 7,472,304 B2 | 12/2008 | Malekkhosravi et al. | |
| 2009/0323456 A1 * | 12/2009 | Gomm | 365/233.1 |
| 2013/0120036 A1 * | 5/2013 | Zhu et al. | 327/156 |

* cited by examiner

*Primary Examiner* — Cassandra Cox
(74) *Attorney, Agent, or Firm* — Lowe Hauptman & Ham, LLP

(57) ABSTRACT

An integrated circuit die stack includes a first die having a first phase locked loop (PLL) and a second die having a second PLL. The first PLL includes a first voltage controlled oscillator (VCO) and the second PLL includes a second VCO. The first VCCO and the second VCCO share a frequency divider and a loop filter.

20 Claims, 12 Drawing Sheets

PHASE-LOCKED LOOPS THAT SHARE A LOOP FILTER AND FREQUENCY DIVIDER

CROSS-REFERENCE TO RELATED APPLICATION

The present application is a Continuation-in-Part of U.S. application Ser. No. 13/407,394, filed Feb. 28, 2012, which claims priority of U.S. Provisional Application No. 61/565,271, filed Nov. 30, 2011, which are incorporated herein by reference in their entireties.

FIELD OF DISCLOSURE

The present disclosure is related to phase-locked loops (PLLs) that share a loop filter.

BACKGROUND

With a progress in the technology of die manufacturing and packaging, three-dimensional integrated circuits (3DICs) have been developed in which two or more dies are integrated vertically and/or horizontally in a single die stack. Depending on the functional requirement, each stacked die includes a PLL to generate an individual clock. The frequencies of the clocks in each of the stacked dies therefore vary. Further, existing PLLs generally occupy a large die area and therefore increase the total die area of each stacked die.

DETAILED DESCRIPTION

Figure 1:
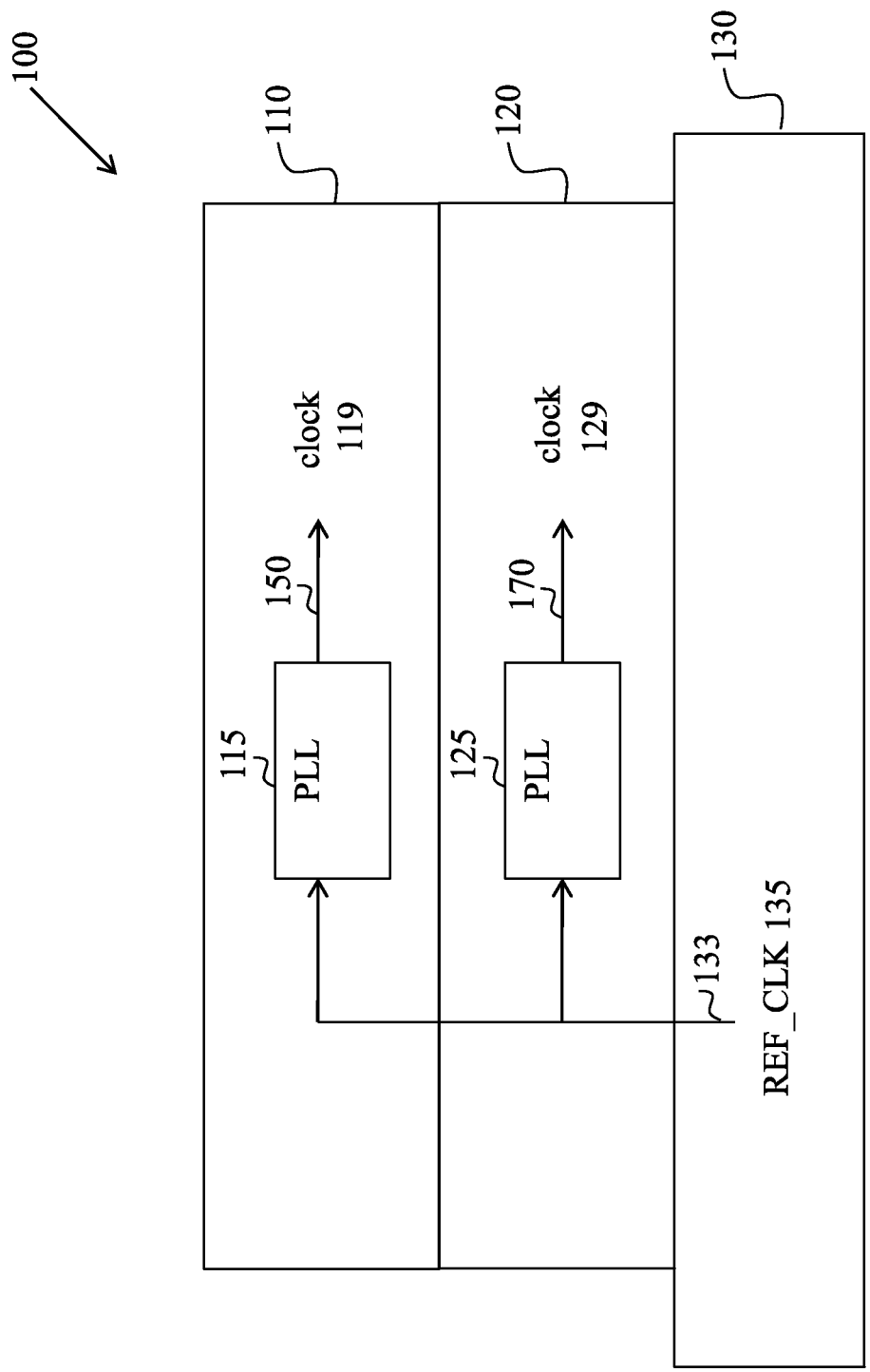
FIG. 1 is a block diagram illustrating clock generation for each die in a die stack in accordance with some embodiments.

The making and using of the embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, unless expressly described otherwise.

Some embodiments have one or a combination of the following features and/or advantages. Each die in a die stack includes a PLL. The PLLs in each die of the die stack share a loop filter. As a result, the size of each stacked die is smaller, resulting in additional functions being provided in a same die size area. In other words, the functional capacity per volume unit of each die is higher. By sharing the loop filter, the clock phase of the clocks of the PLLs take turns to lock with a reference clock.

FIG. 1 is a block diagram of a die stack 100 illustrating the clock generation for each die in a die stack, according to an example embodiment. The die stack 100 includes dies 110, 120 and an interposer 130. In some embodiments, each of dies 110 and 120 is symmetrically and/or asymmetrically stacked on the interposer 130, either on the same side or on the different side of the interposer 130. In some embodiments, the dies 110 and 120 are heterogeneous dies. In some other embodiments, the dies 110 and 120 are homogeneous dies. In some embodiments, the interposer 130 provides connections between the die stack 100 and external inputs/outputs (I/Os). The interposer 130 is formed of materials such as semiconductor materials, dielectric materials, or the like. In various embodiments, the interposer 130 is a printed circuit board (PCB), an integrated circuit carrier board, or any other board. Although FIG. 1 only shows two dies 110 and 120 stacked on the interposer 130, any number of dies is within the scope of various embodiments.

A clock signal REF_CLK 135 on an electrical connection 133 may be generated by circuitries located in the interposer 130 or in other dies mounted on the interposer 130, such as die 110, 120, etc. The clock signal REF_CLK 135 is electrically connected to PLLs 115 and 125 of dies 110 and 120, respectively. In some embodiments, the clock signal REF_CLK 135 is a periodic clock signal generated from a reference clock source, such as a crystal oscillator. The PLL 115 and 125 output clocks 119 and 129 through electrical connections 150 and 170, respectively. In some embodiments, clocks 119 and 129 are transmitted to and usable by other circuit blocks of the dies 110 and 120, respectively. The electrical connection referred in this document may be any form of interconnections, such as metal, vias, poly, quantum lines or dots (OD), redistribution layer (RDL), through substrate vias (TSVs), or any conductor made of other materials.

Figure 2A:
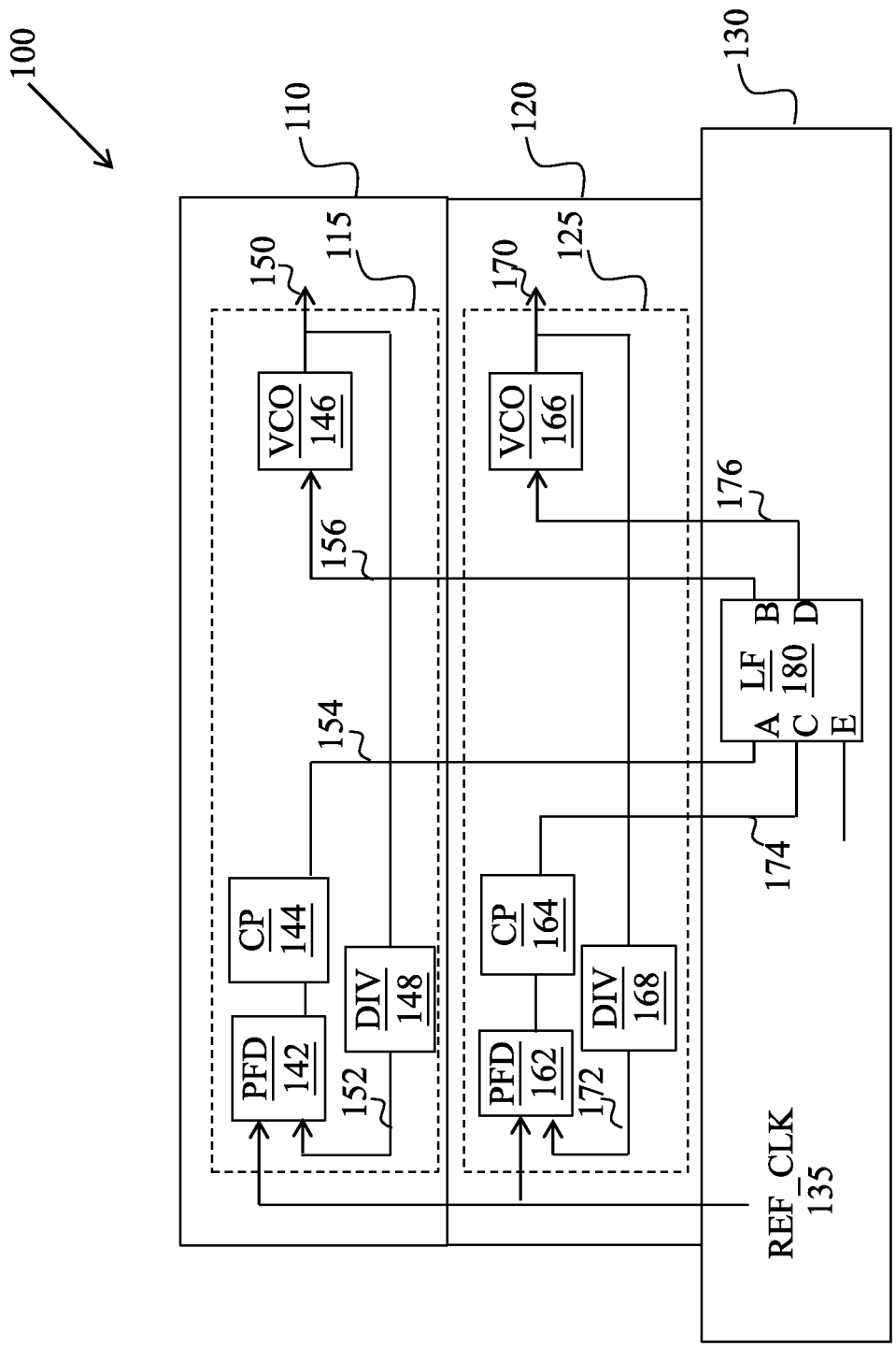
FIG. 2A is a block diagram illustrating a clock generation means for each die in a die stack in accordance with some embodiments.

With reference to FIG. 2A, die stack 100 is shown in detail, according to an example embodiment. The dies 110 and 120 include PLLs 115 and 125, respectively. In some embodiments, the PLL 115 is similar to the PLL 125. The interposer 130 includes a loop filter LF 180 to be shared by the PLLs 115 and 125.

The PLL 115 includes a phase and frequency detector (PFD) 142, a charge pump (CP) 144, a voltage controlled oscillator (VCO) 146, and a feedback divider (DIV) 148. The PFD 142 receives two inputs, a clock signal REF_CLK 135 and a local clock signal 152, which is a divided version of an output clock of the VCO 146 through electrical connection 150. The PFD 142 determines the relative phase difference between the REF_CLK 135 and the local clock signal 152, and outputs a signal that is proportional to the phase difference and that is fed into the CP 144. The CP 144 converts the input signal into an analog voltage and feeds this analog voltage to a port A of the LF 180 in the interposer 130 through an electrical connection 154. In some embodiments, the LF 180 is a low-pass filter that removes the high frequency components in the analog voltage outputted by the CP 144, and outputs a DC voltage. The DC voltage is outputted from a port B of the LF 180 and fed to the VCO 146 through the electrical connection 156. The VCO 146 increases or decreases the frequency of the output clock on the electrical connection 150 according to the corresponding increased or decreased DC voltage. The DIV 148 receives the output clock through electrical connection 150 and provides the local clock signal 152 to PFD 142. The frequency of the local clock signal 152 is divided from the frequency of the output clock on electrical connection 150 by a predetermined ratio. As illustratively shown in FIG. 2A, elements of the PLL 115, combined with the LF 180, form a feedback loop. For example, PFD 142, CP 144, LF 180, VCO 146, and DIV 148 form the feedback loop.

Similarly, the PLL 125 includes a phase and frequency detector (PFD) 162, a charge pump (CP) 164, a voltage controlled oscillator (VCO) 166, and a feedback divider (DIV) 168. The connectivity in the PLL 125 is similar to that of the PLL 115, except that an analog voltage outputted from the CP 164 is fed to a port C of the LF 180 through electrical connection 174, and a DC voltage outputted from a port D of the LF 180 is fed to the VCO 166 through electrical connection 176. As a result, elements of the PLL 125, together with the LF 180, form another feedback loop. For example, PFD 162, CP 164, LF 180, VCO 166, and DIV 168 form the second feedback loop. As illustratively shown in FIG. 2A, the PLLs 115 and 125 share the common LF 180 in the interposer 130. In some embodiments, a circuit (not shown) generates a selection signal to a port E of the LF 180 to select the feedback loop that uses the common LF 180 at a particular period of time. The circuit may be located in the interposer 130 or in one of the dies stacked on the interposer 130, such as a die 110, a die 120, etc.

In FIG. 2A, the LF 180 is placed in the interposer 130 for illustration. The LF 180, however, may be placed in the dies 110, 120, or another die stacked on the interposer 130.

Figure 2B:
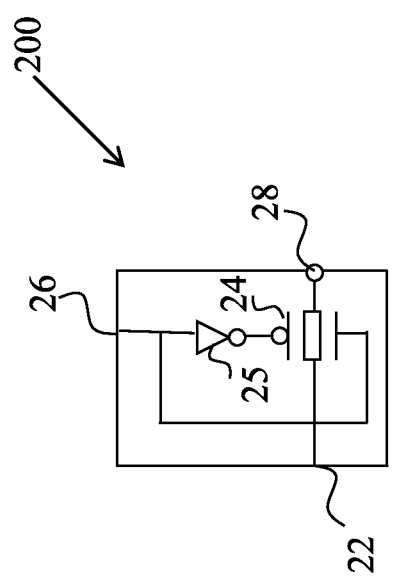
FIG. 2B is a schematic view of a programmable connection element in accordance with some embodiments.

FIG. 2B is a schematic of a programmable connection element 200 according to an example embodiment. Programmable connection element 200 is for use by the LFs 300 and 400 in the corresponding FIGS. 3 and 4, in accordance with some embodiments. A transmission gate 24 is used to connect electrical ports 22 and 28, with a switch control (not shown) from electrical port 26. The programmable connection element 200 is activated to electrically connect the electrical port 22 to the electrical port 28 when the electrical port 26 receives a logical high voltage. In contrast, the programmable connection element 200 is disabled to electrically disconnect the electrical port 22 from the electrical port 28 when the electrical port 26 receives a logical low voltage. An inverter 25 inverts the signal on electrical port 26 and provides a signal that controls the transmission gate 24.

Figure 3:
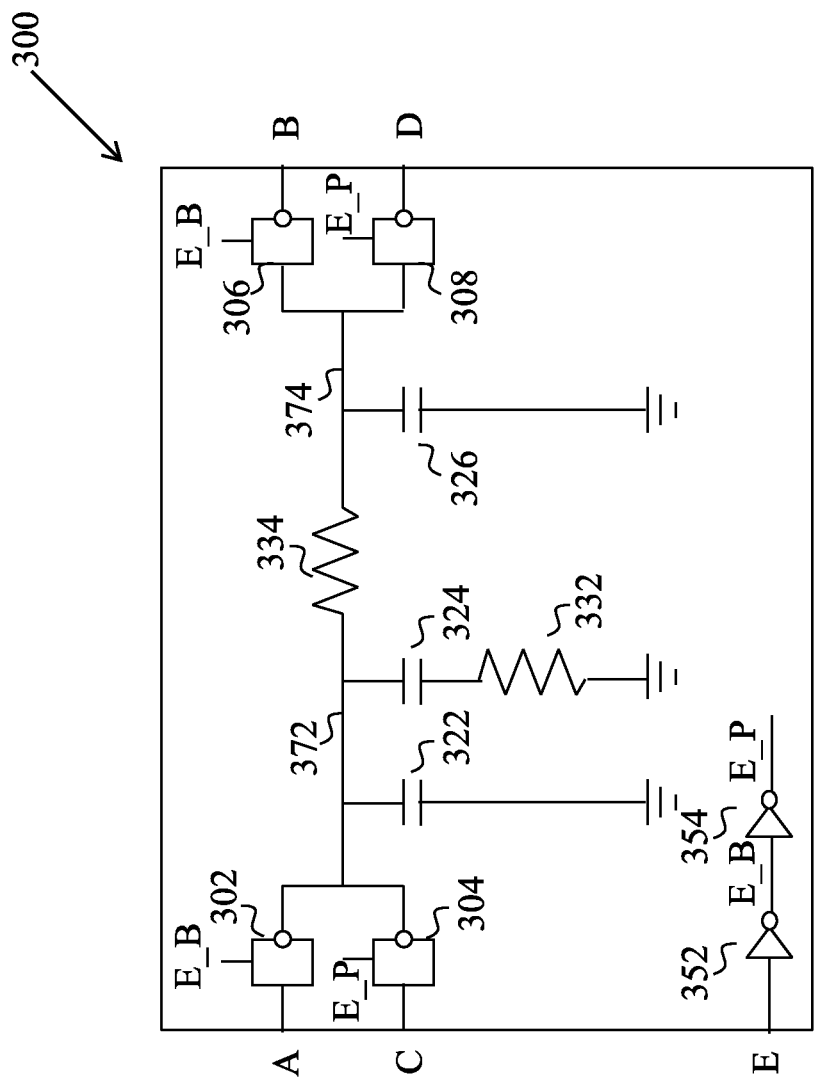
FIG. 3 is a schematic diagram of the loop filter in accordance with some embodiments.

FIG. 3 is a loop filter 300 illustrating an implementation of the LF 180 in FIG. 2, according to an example embodiment. The loop filter 300 comprises programmable connection elements 302, 304, 306 and 308; capacitors 322, 324 and 326; and resistors 332 and 334. The programmable connection elements 302, 304, 306 and 308 are implemented using the programmable connection element 200 shown in FIG. 2B. For illustration, ports indicated by a circle for the programmable connection elements 302, 304, 306 and 308 in FIG. 3 correspond to the electrical port 28 shown in FIG. 2B. The ports positioned on the opposite side of the electrical port 28 of programmable connection elements 302, 304, 306 and 308 correspond to the electrical port 22 shown in FIG. 2B and the remaining port corresponds to the electrical port 26 shown in FIG. 2B.

The programmable connection element 302 controls a connection between a port A of the LF 300 and an electrical connection 372. The programmable connection element 304 controls a connection between a port C of the LF 300 and the electrical connection 372. The programmable connection element 306 controls a connection between electrical connection 374 and a port B of the LF 300. The programmable connection element 308 controls a connection between the electrical connection 374 and a port D of the LF 300. Signals used to connect to the corresponding electrical port 26 shown in FIG. 2B are generated from the selection signal on port E of the LF 300. For example, a signal E_B, which is connected to a port E through inverter 352, is connected to the corresponding electrical port 26 shown in FIG. 2B of programmable connection elements 302 and 306. In addition, a signal E_P, which is connected to a port E through inverter 352 and 354, is connected to the corresponding electrical port 26 shown in FIG. 2B of programmable connection elements 304 and 308.

Capacitor 322 is connected between the electrical connection 372 and a ground. Capacitor 324 and resistor 332 are serially connected between the electrical connection 372 and the ground. Capacitor 326 is connected between the electrical connection 374 and the ground. Resistor 334 is connected between the electrical connection 372 and 374.

Inverter 352 inverts the signal on the port E to provide signal E_B while inverter 354 inverts signal E_B to provide signal E_P. As a result, when the port E is logically low, the signal E_B is logically high and the signal E_P is logically low. The programmable connection elements 302 and 306 are therefore activated while the programmable connection elements 304 and 308 are disabled. As a result, there is an electrical connection between the port A and the port B through the programmable connection element 302, the electrical connection 372, the resistor 334, the electrical connection 374 and the programmable connection element 306. There is, however, no electrical connection between the port C and the port D because the programmable connection elements 304 and 308 are disabled. In contrast, when the port E is logically high, the signal E_B is logically low and the signal E_P is logically high. The programmable connection elements 302 and 306 are therefore disabled while the programmable connection elements 304 and 308 are activated. As a result, there is no electrical connection between the port A and the port B because the programmable connection elements 302 and 306 are disabled. There is, however, an electrical connection between the port C and the port D through the programmable connection element 304, the electrical connection 372, the resistor 334, the electrical connection 374 and the programmable connection element 308.

In FIG. 3, the capacitors 322, 324 and 326 are placed at the same die as the resistors 332 and 334. The capacitors 322, 324 and 326, however, may be placed at different levels of hierarchy in a die stack as the resistors 332 and 334. For example, in some embodiments, the capacitors 322, 324 and 326 are placed in the interposer 130 in FIG. 2A while the resistors 332 and 334 are placed in the die 110 in FIG. 2A or a PC board that the interposer 130 is stacked on. In some other embodiments, at least one of the capacitors 322, 324 and 326 or the resistors 332 and 334 may be placed at a different level of hierarchy in a die stack. For example, all of the capacitors and resistors are located in the interposer 130 except that the resistor 332 is located in the die 110 or a PC board that the interposer 130 is stacked on. The resistors 332 and 334 may be formed by metal routing, poly routing, OD routing, external resistor component, or the like. The capacitors 322, 324 and 326 may be formed by Metal-Insulator-Metal (MIM) capacitors and/or Metal-Oxide-Metal (MOM) capacitors, or the like.

In FIG. 2, the PLL 115 is similar to the PLL 125 for ease of illustration. The PLL 115, however, may be different from the PLL 125. For example, in some embodiments, the VCO 146 in the PLL 115 is designed to output a 5 GHz clock, while the VCO 166 in the PLL 125 is designed to output a 1 GHz clock. In such a situation, the LF 180 is configured and adaptively controlled to provide corresponding bandwidths to corresponding feedback loops, as described in detail in FIG. 4.

Figure 4:
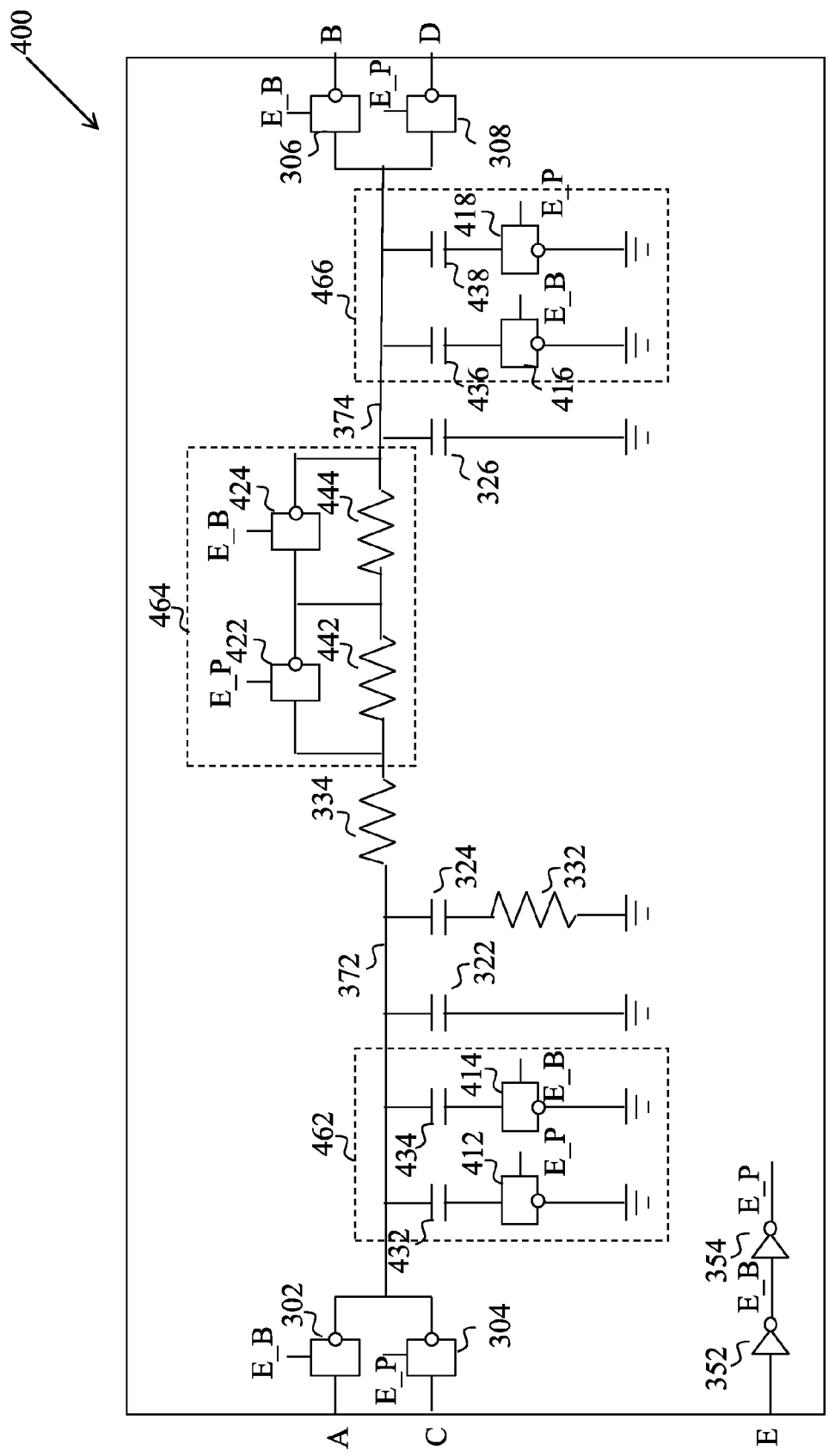
FIG. 4 is a schematic diagram of the loop filter in accordance with some further embodiments.

FIG. 4 is a loop filter 400 illustrating another implementation of the LF 180 in FIG. 2, according to another example embodiment. The loop filter 400 is similar to the loop filter 300 in FIG. 3, except with additional circuits 462, 464 and 466. The circuit 462 includes capacitor 432 and programmable connection element 412 that are serially connected between the electrical connection 372 and the ground. The circuit 462 also includes capacitor 434 and programmable connection element 414 that are serially connected between the electrical connection 372 and the ground. The circuit 466 includes capacitor 436 and programmable connection element 416 that are serially connected between the electrical connection 374 and the ground. The circuit 466 also includes capacitor 438 and programmable connection element 418 that are serially connected between the electrical connection 374 and the ground. The circuit 464 is serially connected between the resistor 334 and the electrical connection 374, and includes resistors 442 and 444, and programmable connection elements 422 and 424. In circuit 464, the resistor 442 that is in parallel with the programmable connection element 422 is serially connected with the resistor 444. Resistor 444 is connected in parallel with the programmable connection element 424. In some embodiments, the programmable connection elements 412, 414, 422, 424, 416, and 418 are implemented using the programmable connection element 200 shown in FIG. 2B.

The signal E_B is connected to the corresponding electrical port 26 shown in FIG. 2B of programmable connection elements 414, 416 and 424. The signal E_P is connected to the corresponding electrical port 26 shown in FIG. 2B of programmable connection elements 412, 418 and 422. When the port E is logically low, the signal E_B is logically high and E_P is logically low. The programmable connection elements 414, 416 and 424 are therefore activated while the programmable connection elements 412, 418 and 422 are disabled. As a result, the capacitor 434 is configured to connect the electrical connection 372 and the ground. Similarly, the capacitor 436 is configured to connect the electrical connection 374 and the ground. In addition, the resistor 442 is configured to connect the resistor 334 and the electrical connection 374. In contrast, when the port E is logically high, the signal E_B is logically low and E_P is logically high. The programmable connection elements 414, 416 and 424 are therefore disabled while the programmable connection elements 412, 418 and 422 are activated. As a result, the capacitor 432 is configured to connect the electrical connection 372 and the ground. Similarly, the capacitor 438 is configured to connect the electrical connection 374 and the ground. In addition, the resistor 444 is configured to connect the resistor 334 and the electrical connection 374. In this way, the total effective capacitance of capacitor 322 and 326, and the total effective resistance of resistor 334 are configurable to change in order to provide designated bandwidths for corresponding PLL feedback loops.

In FIG. 4, the capacitors 322, 324, 326, 432, 434, 436 and 438 are placed at the same die as the resistors 332, 334, 442 and 444. The capacitors 322, 324, 326, 432, 434, 436 and 438, however, may be placed at different levels of hierarchy in a die stack as the resistors 332, 334, 442 and 444. For example, the capacitors 322, 324, 326, 432, 434, 436 and 438 are placed at the interposer 130 in FIG. 2A while the resistors 332, 334, 442 and 444 are placed in the die 110 in FIG. 2A or a PC board that the interposer 130 is stacked on. In other embodiments, at least one of the capacitors 322, 324, 326, 432, 434, 436, 438 or the resistors 332, 334, 442 and 444 may be placed at a different level of hierarchy in a die stack. For example, all of the capacitors and resistors are located in the interposer 130 except that the resistor 332 is located in the die 110 or a PC board that the interposer 130 is stacked on. The resistors 332, 334, 442 and 444 may be formed by metal routing, poly routing, OD routing, external resistor component, or the like. The capacitors 322, 324, 326, 432, 434, 436 and 438 may be formed by Metal-Insulator-Metal (MIM) capacitors and/or Metal-Oxide-Metal (MOM) capacitors, or the like.

Figure 5:
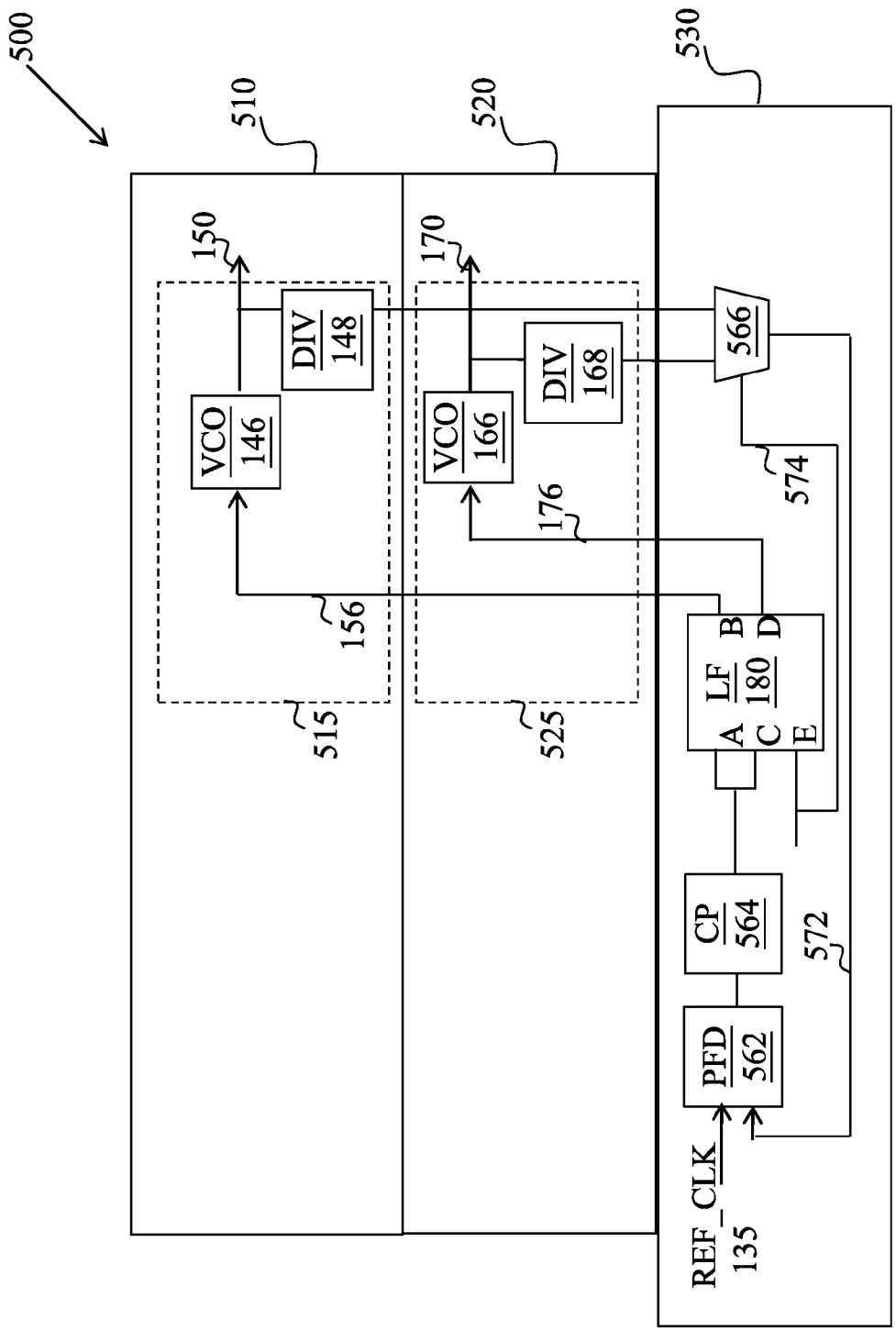
FIG. 5 is a block diagram illustrating another clock generation means for each die in a die stack in accordance with some embodiments.

With reference to FIG. 5, die stack 500 illustrates another clock generation means of each die in a die stack of FIG. 1, according to an example embodiment. The die stack 500 includes dies 510 and 520 and an interposer 530. The dies 510 and 520 include clock generation circuits 515 and 525, respectively. The interposer 530 includes a PFD 562, a CP 564, a LF 180 and a multiplexer 566. The PFD 562 is similar to the PFD 142 or 162 in FIG. 2. The CP 564 is similar to the CP 144 or 164 in FIG. 2. The LF 180 may be implemented using the LF300 in FIG. 3 or the LF 400 in FIG. 4. The clock generation circuit 515 includes a VCO 146 and a DIV 148. A DC voltage outputted from the LF 180 is fed to the VCO 146 through an electrical connection 156. The VCO 146 outputs a clock to electrical connection 150, which is also fed to the multiplexer 666 through the DIV 148, and then connected to the PFD 562 through an electrical connection 572. As a result, the PFD 562, the CP 564, the LF 180, the multiplexer 566 combined with clock generation circuit 515 form a PLL feedback loop. For example, PFD 562, CP 564, LF 180, VCO 146, DIV 148, and multiplexer 566 form the feedback loop.

Similarly, the clock generation circuit 525 includes a VCO 166 and a DIV 168. A DC voltage outputted from the LF 180 is fed to the VCO 166 through an electrical connection 176. The VCO 166 outputs a clock to electrical connection 170, which is also fed to the multiplexer 566 through the DIV 168, and then connected to the PFD 562 through the electrical connection 572. As a result, the PFD 562, the CP 564, the LF 180, and the multiplexer 566 together with clock generation circuit 525 form another PLL feedback loop. For example, PFD 562, CP 564, LF 180, VCO 166, DIV 168, and multiplexer 566 form the feedback loop.

In FIG. 5, the PFD 562, the CP 564, the LF 180 and the multiplexer 566 are placed in the interposer 130 for ease of illustration. The PFD 562, the CP 564, the LF 180 or the multiplexer 566, however, may be placed in the dies 110, 120, or other die stacked on the interposer 130.

Figure 6:
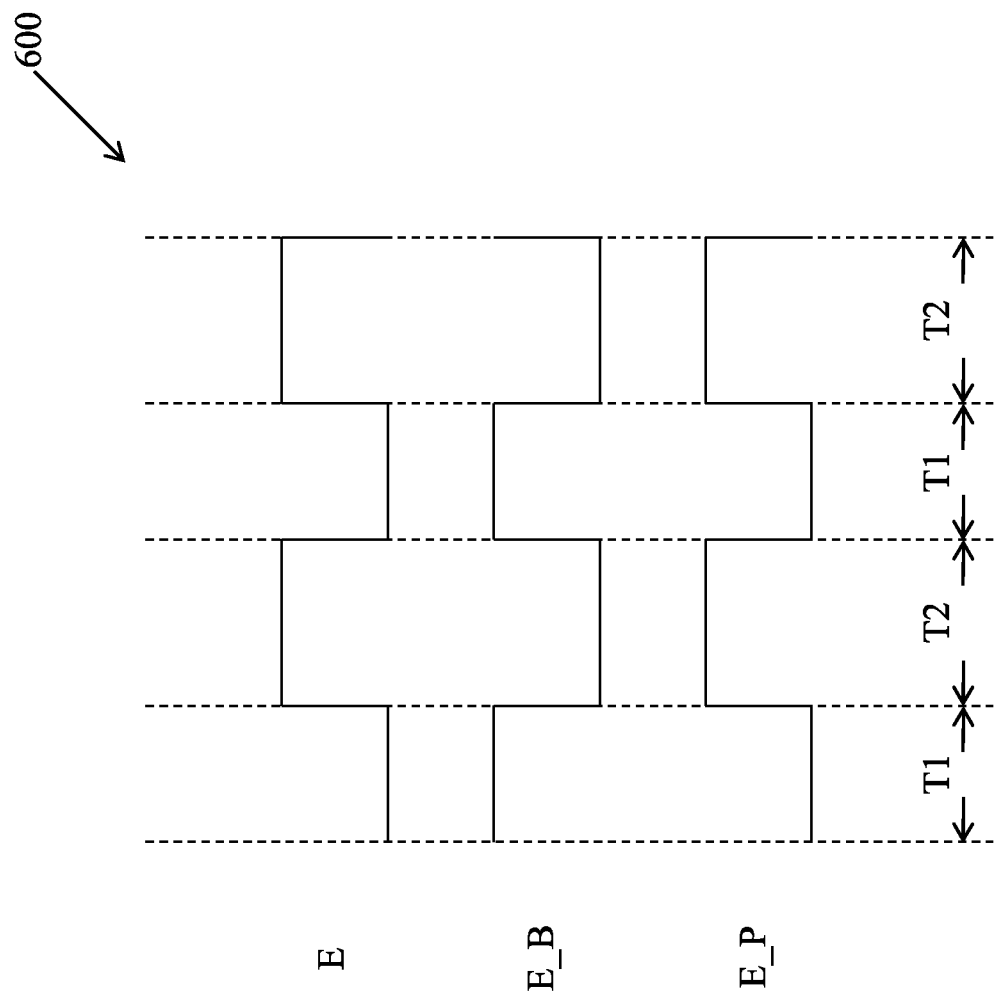
FIG. 6 illustrates a waveform view of a selection signal on port E of the loop filter in accordance with some embodiments.

With reference to FIG. 6, waveform 600 illustrates the relationship of feedback loop selection signals, according to an example embodiment. In time period T1, the selection signal on the port E and the signal E_P are logically low, and the signal E_B is logically high. As a result, the feedback loop that includes the PLL 115 in FIG. 2A or the clock generation circuit 515 in FIG. 5 is a closed loop. The clock phase of the clock on the electrical connection 150 in FIG. 2A or FIG. 5 is locked with regard to the clock REF_CLK 135 within the corresponding time period T1. In time period T2, the selection signal on the port E and the signal E_P are logically high, and the signal E_B is logically low. As a result, the feedback loop that includes the PLL 125 in FIG. 2A or the clock generation circuit 525 in FIG. 5 is a closed loop. The clock phase of the clock on the electrical connection 170 in FIG. 2A or FIG. 5 is locked to the signal REF_CLK 135 within the corresponding time period T2. Time period T1 is followed by time period T2, which is in turn followed by time period T1. This periodic phase locking for each of the feedback loops is performed continuously during functional operations of the die stack 100 or 500. In some embodiments, the time period T1 is different from the time period T2. In some other embodiments, the time period T1 is to the same as the time period T2.

Figure 7:
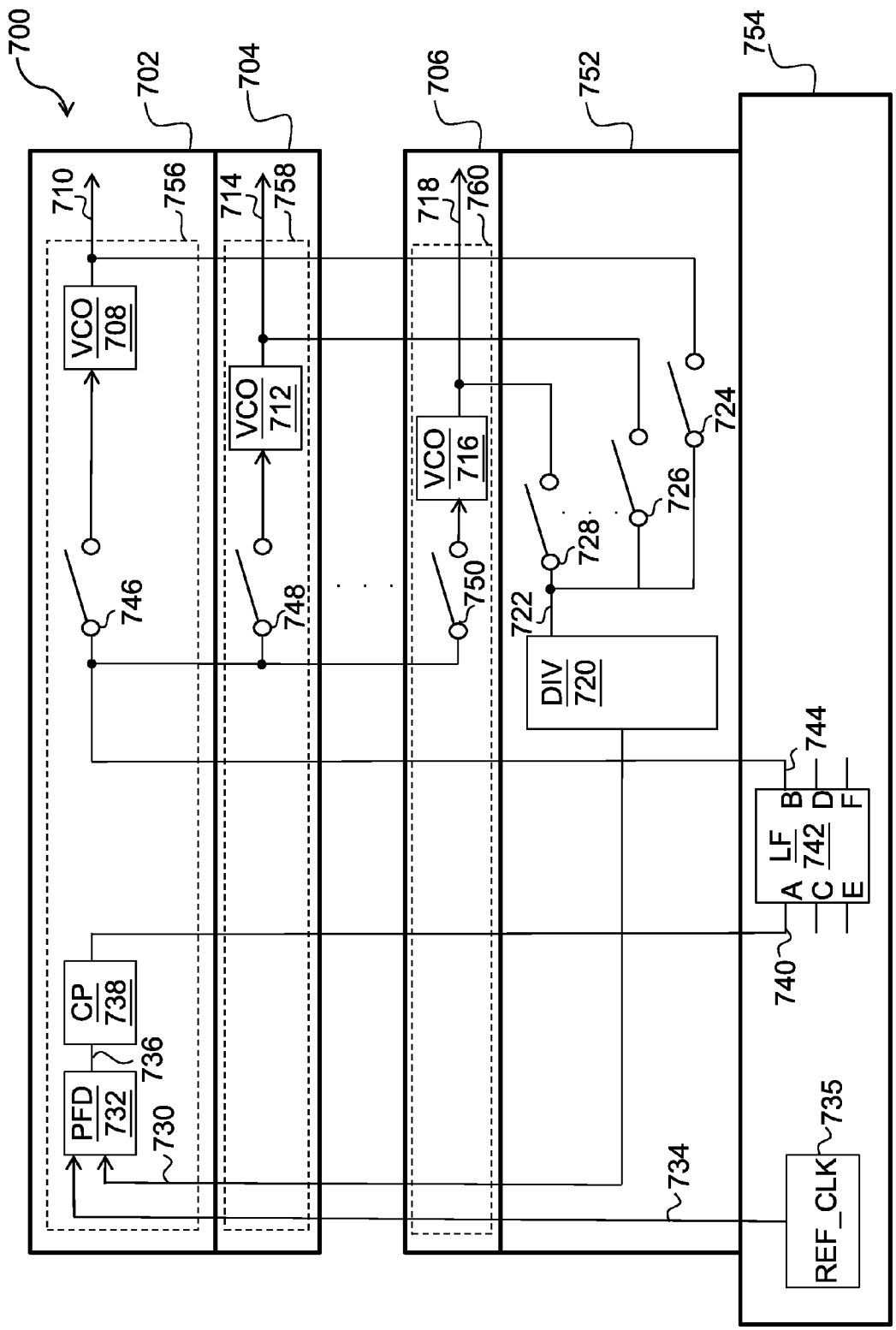
FIG. 7 is a block diagram of a multiple frequency clock generator in a die stack in accordance with some embodiments.

FIG. 7 is a block diagram of a multiple frequency clock generator 700 in accordance with some embodiments. The multiple frequency clock generator 700 is not limited to a particular number of die 702, 704, 706 in a die stack. Each die 702, 704, 706 includes a voltage controlled oscillator (VCO). Die 702 includes voltage controlled oscillator (VCO) 708 having an output clock 710. Die 704 includes VCO 712 having an output clock 714. Die 706 includes VCO 716 having an output clock 718. The number of VCOs is not limited. Each VCO 708, 712, 716 produces a clock frequency unique with respect to every other VCO 708, 712, 716. In some embodiments, each VCO 708, 712, 716 does not produce a clock frequency unique with respect to every other VCO 708, 712, 716.

A feedback divider (DIV) 720 has a DIV input 722 for receiving one of the output clocks 710, 714, 718. Output clock 710 is electrically connected to DIV input 722 through electrically-controlled switch 724. Output clock 714 is electrically connected to DIV input 722 through electrically-controlled switch 726. Output clock 718 is electrically connected to DIV input 722 through electrically-controlled switch 728. The switches 724, 726, 728 are controlled such that only one switch is closed at a time, thus, only one output clock 710, 714, 718 is selected and electrically connected to the DIV input 722 of the DIV 720 at a time. In some embodiments, more than one switch is closed at a time. The DIV 720 receives one of the output clocks 710, 714, 718 and provides a local clock signal 730. The frequency of the local clock signal 730 is divided from the frequency of the one selected output clocks 710, 714, 718 by a predetermined ratio. In some embodiments, DIV input 722 has two differential signal terminals. In some embodiments, local clock signal 730 from the DIV 720 includes two differential signals.

Die 702 includes a phase frequency detector (PFD) 732. The PFD 732 receives a reference clock signal (REF_CLK) 734 from a REF_CLK oscillator 735 and the local clock signal 730 from the DIV 720. The PFD 732 determines the relative phase difference between the REF_CLK 734 and the local clock signal 730, and outputs a PFD output signal 736 that is proportional to the phase difference. The PFD output signal 736 is received by a charge pump (CP) 738. The CP 738 converts the PFD output signal 736 into an analog voltage. The analog voltage from the CP 738 is electrically coupled to a port A input terminal 740 of a shared loop filter (LF) 742. The LF 742 is a low-pass filter that removes high frequency components in the analog voltage transmitted by the CP 738, and outputs a low frequency (DC) voltage from a port B 744 of the LF 742. In some embodiments, port A 740 and/or port B 744 of the LF 742 have two differential signal terminals.

The DC voltage from port B 744 of the LF 742 is transmitted to an electrically-controllable switch 746 on die 702, an electrically-controllable switch 748 on die 704 and an electrically-controllable switch 750 on die 706. The DC voltage from port B 744 of the LF 742 is electrically connected to VCO 708 by switch 746. The DC voltage from port B 744 of the LF 742 is electrically connected to VCO 712 by switch 748. The DC voltage from port B 744 of the LF 742 is electrically connected to VCO 716 by switch 750. If switch 746 is closed, VCO 708 increases or decreases the frequency of the output clock 710 according to the corresponding increased or decreased DC voltage from LF 742. If switch 748 is closed, VCO 712 increases or decreases the frequency of the output clock 710 according to the corresponding increased or decreased DC voltage from LF 742. If switch 746 is closed, VCO 716 increases or decreases the frequency of the output clock 710 according to the corresponding increased or decreased DC voltage from LF 742. Switches 746, 748, 750 are controlled such that VCOs 708, 712, 716 having unused output clocks 710, 714, 718 are not electrically connected to port B 744 of the LF 742. In some embodiments, all switches 746, 748, 750 are simultaneously closed.

The DIV 720 is on a die 752 and the LF 742 is on an interposer 754. In some embodiments, the DIV 720 is on die 702, die 704, die 706, interposer 754, or on another die or interposer. In some embodiments the LF 742 is placed on die 702, die 704, die 706, die 752, or on another die or interposer. The location of the DIV 720 and the LF 742 is not limited to any particular die 702, 704, 706, 752 or interposer 754.

In FIG. 7, multiple phase-locked loops (PLLs) share the DIV 720 and LF 742. A PLL 756 is formed by a feedback loop including PFD 732, CP 738, LF 742, switch 746, VCO 708, switch 724, DIV 720 and REF_CLK 734. A PLL 758 is formed by a feedback loop including PFD 732, CP 738, LF 742, switch 748, VCO 712, switch 726, DIV 720 and REF_CLK 734. A PLL 760 is formed by a feedback loop including PFD 732, CP 738, LF 742, switch 750, VCO 716, switch 728, DIV 720 and REF_CLK 734. Thus, PLL 756, PLL 758 and PLL 760 share PFD 732, CP 738, LF 742, DIV 720 and REF_CLK 734.

Frequencies of output clock 710 from PLL 756, output clock 714 from PLL 758 and output clock 718 from PLL 760 are related harmonics. In some embodiments, output clock 710 has a frequency of 5.00 gigahertz (GHz), output clock 714 has a frequency of 2.5 GHz and output clock 718 has a frequency of 1.25 GHz. In some embodiments, the output clocks 710, 714, 718 have frequencies with different harmonics. In some embodiments, output clock 710 has a frequency of 5.00 GHz, output clock 714 has a frequency of 2.4 GHz and output clock 718 has a variable frequency. In some embodiments, the output clocks 710, 714, 718 have frequencies that are not harmonics. In some embodiments, output clock 710 is a frequency synthesizer for Institute of Electrical and Electronic Engineering (IEEE) 802.11a/b/g/n/ac (Wi-Fi) compatible communications, output clock 714 is a frequency synthesizer for Bluetooth-compatible communications and output clock 718 is a variable frequency synthesizer for a tuner.

Figure 8:
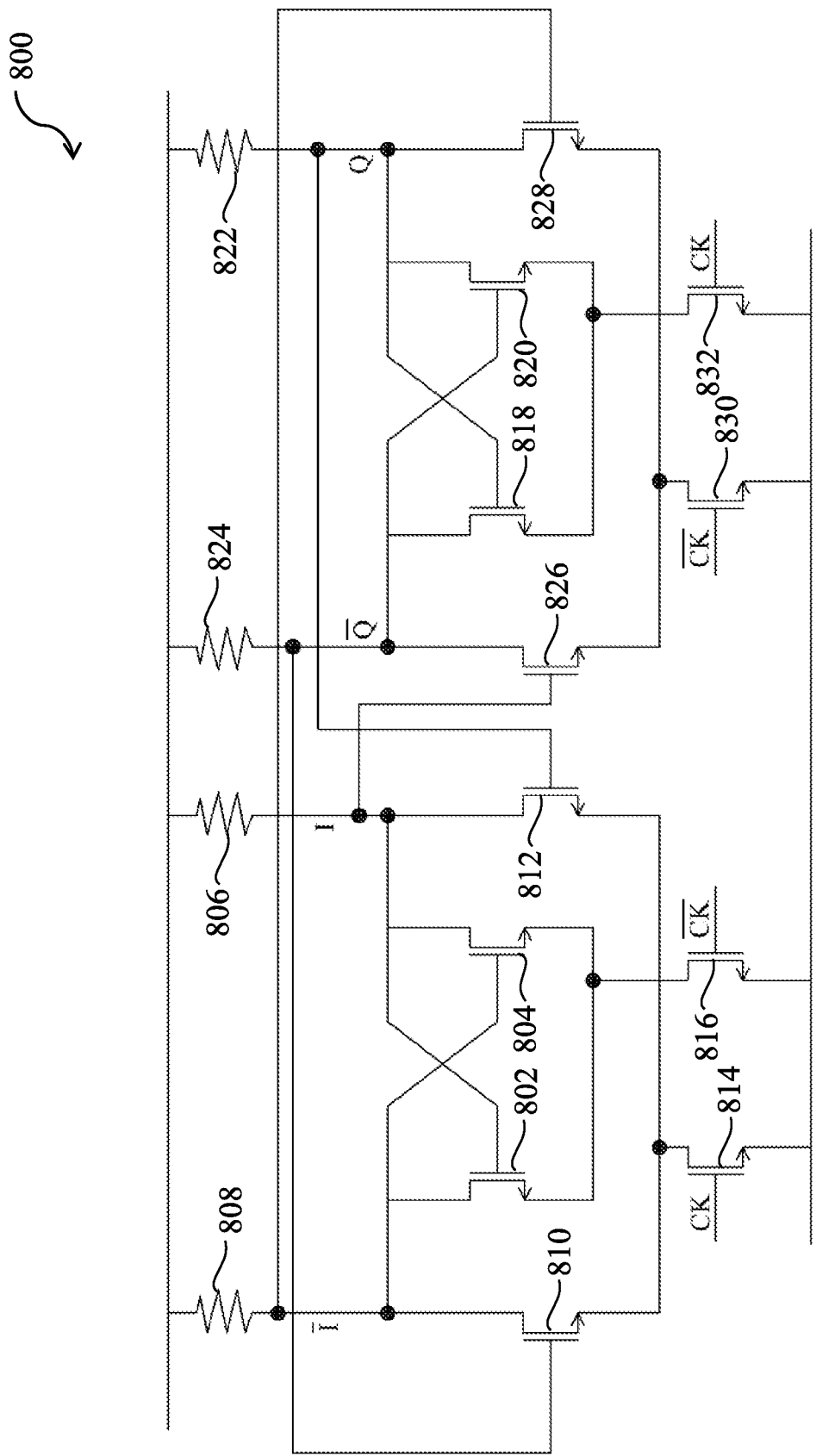
FIG. 8 is a schematic diagram of a feedback divider (DIV) in accordance with some embodiments.

FIG. 8 is a schematic diagram of a divider (DIV) 800 in accordance with some embodiments. In some embodiments, DIV 800 corresponds to DIV 720. DIV 800 is a current mode logic (CML) frequency divider including NMOS transistors. In some embodiments, DIV 800 includes PMOS transistors instead of one or more NMOS transistors. Transistor 802 is cross-coupled with transistor 804, i.e., a gate terminal of transistor 802 is electrically connected to a drain terminal of transistor 804 and a gate terminal of transistor 804 is electrically connected to a drain terminal of transistor 802. The gate terminal of transistor 802 is also electrically connected to an output node I. Node I is electrically coupled to a power supply voltage through resistor 806. The gate terminal of transistor 804 is electrically connected to an output node $\bar{I}$. Electrical signals at node $\bar{I}$ are the inverted version (logical opposite) of signals at node I, and vice versa. Node $\bar{I}$ is electrically coupled to the power supply voltage through resistor 808. A drain terminal of a transistor 810 is electrically connected to node $\bar{I}$ and a drain terminal of a transistor 812 is electrically connected to node I. A source terminal of transistor 810 is electrically connected to a source terminal of transistor 812 and a drain terminal of transistor 814. A source terminal of transistor 802 is electrically connected to a source terminal of transistor 804 and a drain terminal of transistor 816. A source terminal of transistor 814 and a source terminal of transistor 816 are electrically connected to ground. A gate terminal of transistor 814 is electrically connected to a clock (CK) signal. A gate terminal of transistor 816 is electrically connected to a clock bar ($\overline{CK}$) signal.

Transistor 818 is cross-coupled with transistor 820, i.e., a gate terminal of transistor 818 is electrically connected to a drain terminal of transistor 820 and a gate terminal of transistor 820 is electrically connected to a drain terminal of transistor 818. The gate terminal of transistor 818 is also electrically connected to an output node Q. Node Q is electrically coupled to a power supply voltage through resistor 822. The gate terminal of transistor 820 is electrically connected to an output node $\bar{Q}$. Electrical signals at node $\bar{Q}$ are the inverted version (logical opposite) of signals at node Q, and vice versa. Node $\bar{Q}$ is electrically coupled to the power supply voltage through resistor 824. A drain terminal of a transistor 826 is electrically connected to node $\bar{Q}$ and a drain terminal of a transistor 828 is electrically connected to node Q. A source terminal of transistor 826 is electrically connected to a source terminal of transistor 828 and a drain terminal of transistor 830. A source terminal of transistor 818 is electrically connected to a source terminal of transistor 820 and a drain terminal of transistor 832. A source terminal of transistor 830 and a source terminal of transistor 832 are electrically connected to ground. A gate terminal of transistor 830 is electrically connected to the clock (CK) signal. A gate terminal of transistor 832 is electrically connected to the clock bar ($\overline{CK}$) signal.

Node $\bar{Q}$ is electrically connected to a gate input of transistor 810. Node Q is electrically connected a gate input of transistor 812. Node I is electrically connected to a gate input of transistor 826. Node $\bar{I}$ is electrically connected a gate input of transistor 828. Clock (CK) signal and clock bar ($\overline{CK}$) signal are differential inputs and correspond to DIV input 722 of DIV 720. Node I and node $\bar{I}$ are differential outputs and correspond to local clock signal 730 of DIV 720. Node Q and node $\bar{Q}$ are differential outputs and also correspond to local clock signal 730 of DIV 720. Node Q and node $\bar{Q}$ are a duplicate set of differential outputs of node I and node $\bar{I}$. The frequency of a local clock signal at node Q, node $\bar{Q}$, node I and node $\bar{I}$ is divided from the frequency of the CK and $\overline{CK}$ signals by a predetermined ratio. The DIV 800 is particularly well adapted for high frequency applications employing differential inputs and outputs.

Figure 9:
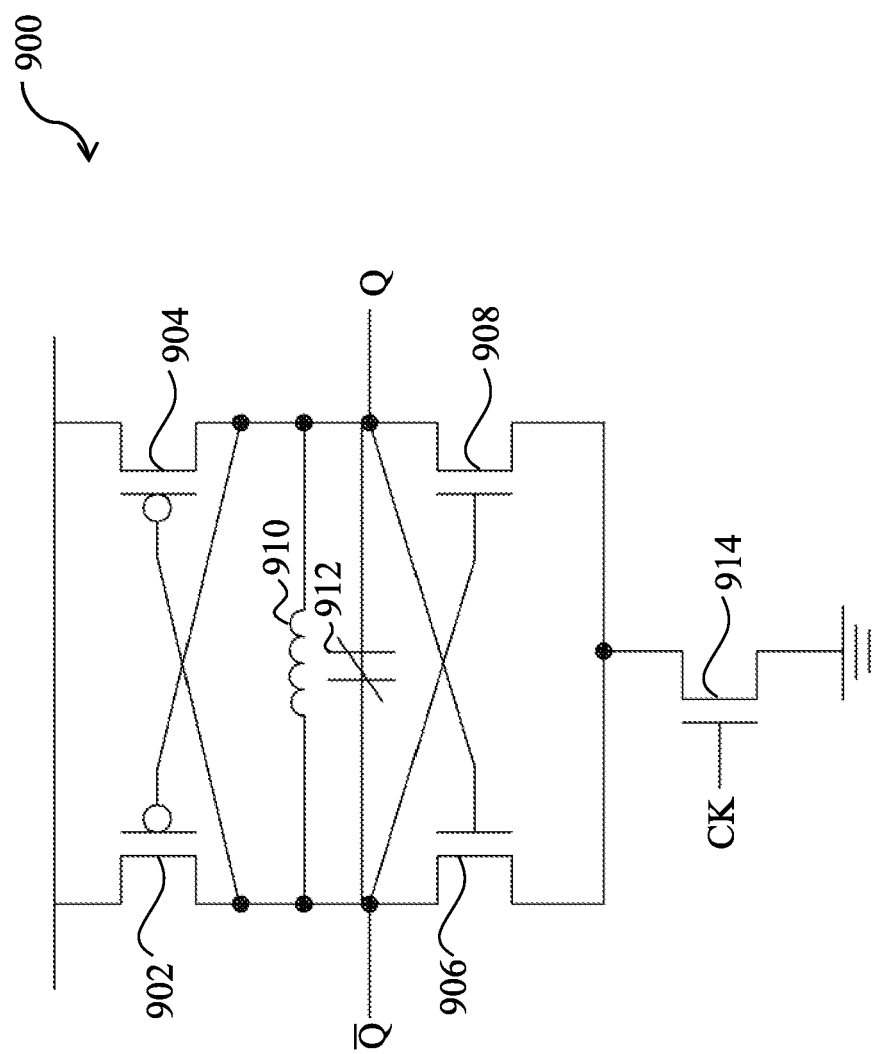
FIG. 9 is a schematic diagram of a feedback divider (DIV) in accordance with some embodiments.

FIG. 9 is a schematic diagram of a feedback divider (DIV) 900 in accordance with some embodiments. In some embodiments, DIV 900 corresponds to DIV 720. DIV 900 is an injection locking frequency divider that includes both NMOS and PMOS transistors. PMOS transistor 902 is cross-coupled with PMOS transistor 904, i.e., a gate terminal of transistor 902 is electrically connected to a drain terminal of transistor 904 and a gate terminal of transistor 904 is electrically connected to a drain terminal of transistor 902. The gate terminal of transistor 902 is electrically connected to output node Q. The gate terminal of transistor 904 is electrically connected to output node $\bar{Q}$. Electrical signals at output node $\bar{Q}$ are the inverted version (logical opposite) of signals at output node Q, and vice versa. A source terminal of transistor 902 and a source terminal of transistor 904 are electrically connected to a power supply voltage.

NMOS transistor 906 is cross-coupled with NMOS transistor 908, i.e., a gate terminal of transistor 906 is electrically connected to a drain terminal of transistor 908 and a gate terminal of transistor 908 is electrically connected to a drain terminal of transistor 906. The gate terminal of transistor 906 is electrically connected to output node Q. The gate terminal of transistor 908 is electrically connected to output node $\bar{Q}$. A drain terminal of transistor 906 is electrically connected to the drain terminal of transistor 902. A drain terminal of transistor 908 is electrically connected to the drain terminal of transistor 904.

One terminal of an inductor 910 is electrically connected to output node $\bar{Q}$ and another terminal of the inductor 910 is electrically connected to output node Q. One terminal of a variable capacitor 912 is electrically connected to output node $\bar{Q}$ and another terminal of the variable capacitor 912 is electrically connected to output node Q. A drain terminal of an NMOS transistor 914 is electrically connected to the source terminal of transistor 906 and the source terminal of transistor 908. A source terminal of transistor 914 is electrically connected to ground. A gate terminal of transistor 914 is electrically connected to a clock (CK) signal.

The frequency of a local clock signal at terminal Q is divided from the frequency of the CK signal by a predetermined ratio to produce a differential local clock signal at nodes Q and $\bar{Q}$. The DIV 900 is particularly well adapted for high frequency applications employing a single input and differential outputs.

Figure 10:
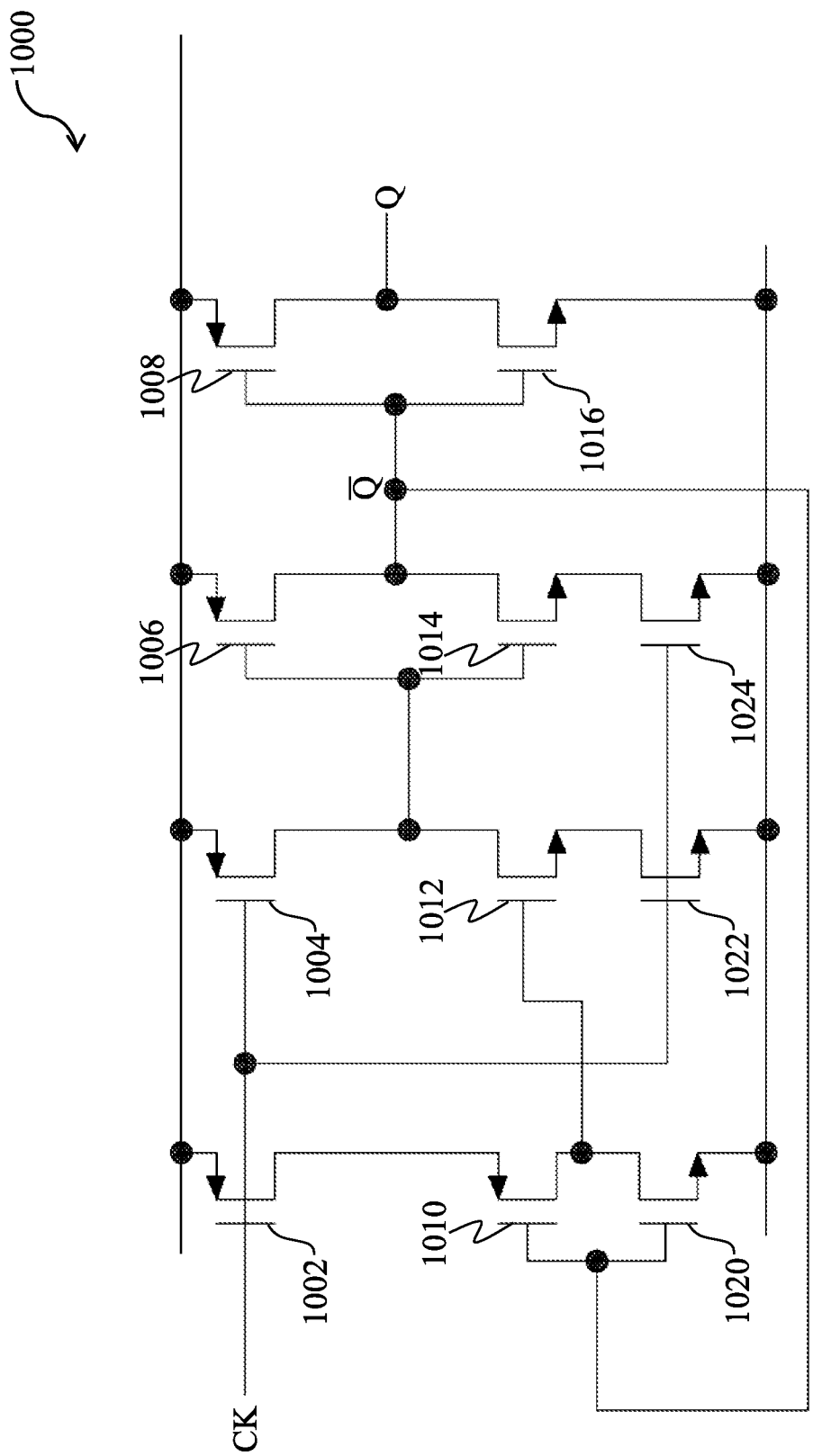
FIG. 10 is a schematic diagram of a feedback divider (DIV) in accordance with some embodiments.

FIG. 10 is a schematic diagram of a feedback divider (DIV) 1000 in accordance with some embodiments. In some embodiments, DIV 1000 corresponds to DIV 720. DIV 1000 is a single phase clock (TSPC) frequency divider that includes both NMOS and PMOS transistors. A PMOS transistor 1002, a PMOS transistor 1004, a PMOS transistor 1006 and a PMOS transistor 1008 each have a source terminal electrically connected to a power supply voltage. A drain terminal of transistor 1002 is electrically connected to a source terminal of a PMOS transistor 1010. A drain terminal of transistor 1004 is electrically connected to a drain terminal of an NMOS transistor 1012. A drain terminal of transistor 1006 is electrically connected to a drain terminal of an NMOS transistor 1014. A drain terminal of transistor 1008 is electrically connected to a drain terminal of an NMOS transistor 1016.

A drain terminal of transistor 1010 is electrically connected to a drain terminal of an NMOS transistor 1020. A source terminal of transistor 1012 is electrically connected to a drain terminal of an NMOS transistor 1022. A source terminal of transistor 1014 is electrically connected to a drain terminal of an NMOS transistor 1024. A source terminal of transistor 1016, a source terminal of transistor 1020, a source terminal of transistor 1022, and a source terminal of transistor 1024 are each electrically connected to ground.

A clock (CK) signal is electrically connected to a gate terminal of transistor 1002, a gate terminal of transistor 1004, a gate terminal of transistor 1022 and a gate terminal of transistor 1024. An output node Q is electrically connected to a drain terminal of transistor 1008 and a drain terminal of transistor 1016. An output node $\overline{Q}$ is electrically connected to a drain terminal of transistor 1006, a drain terminal of transistor 1014, a gate terminal of transistor 1008, a gate terminal of transistor 1016, a gate terminal of transistor 1010 and a gate terminal of transistor 1020. Electrical signals at output node $\overline{Q}$ are the inverted version (logical opposite) of signals at output node Q, and vice versa. A drain terminal of transistor 1010 is electrically connected to a drain terminal of transistor 1020 and a gate terminal of transistor 1012. A drain terminal of transistor 1004 is electrically connected to a drain terminal of transistor 1012, a gate terminal of transistor 1006 and a gate terminal of transistor 1014.

The frequency of a local clock signal at terminal Q is divided from the frequency of the CK signal by a predetermined ratio to produce a differential local clock signal at nodes Q and $\overline{Q}$. The DIV 1000 is particularly well adapted for high frequency applications employing a single input and differential outputs where the predetermined ratio is equal to two. In some embodiments the predetermined ration is not equal to two.

Figure 11:
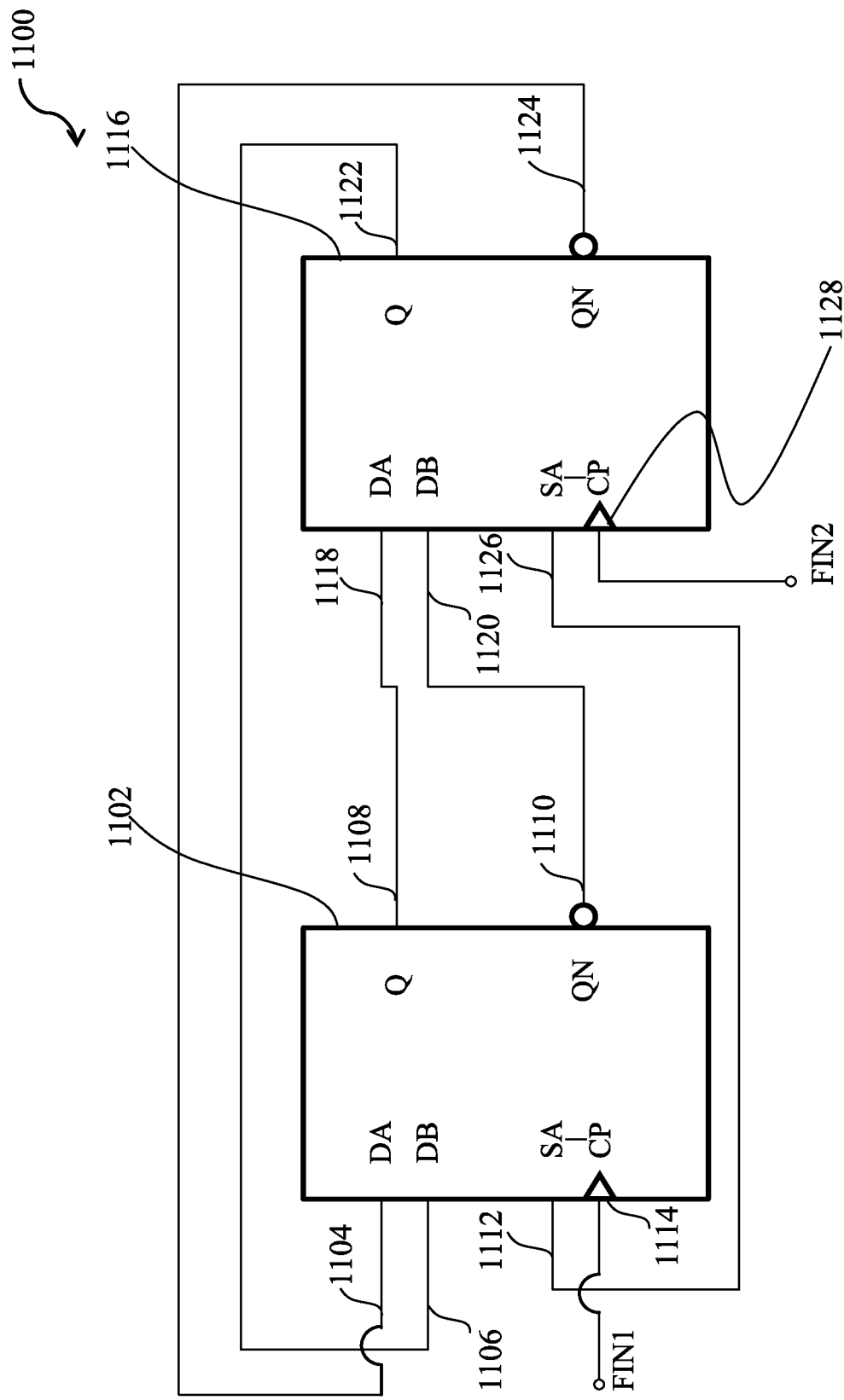
FIG. 11 is a schematic diagram of a feedback divider (DIV) in accordance with some embodiments.

FIG. 11 is a schematic diagram of a feedback divider (DIV) 1100 in accordance with some embodiments. In some embodiments, DIV 1100 corresponds to DIV 720. DIV 1100 is a digital frequency divider that includes two clocked D-type flip flops. A D-type flip flop 1102 includes a differential (DA) input terminal 1104, a differential (DB) input terminal 1106 having the opposite polarity (logical opposite) of the DA input terminal, a differential (Q) output terminal 1108, a differential ($\overline{Q}$) output terminal 1110 having the opposite polarity (logical opposite) of the Q output terminal, a synchronization enable (SA) input terminal 1112, and a clock pulse (CP) input terminal 1114.

Similar to the D-type flip flop 1102, a D-type flip flop 1116 includes a differential (DA) input terminal 1118, a differential (DB) input terminal 1120 having the opposite polarity (logical opposite) of the DA input terminal, a differential (Q) output terminal 1122, a differential ($\overline{Q}$) output terminal 1124 having the opposite polarity (logical opposite) of the Q output terminal, a synchronization enable (SA) input terminal 1126, and a clock pulse (CP) input terminal 1128.

The DA input terminal 1104 is electrically connected to the $\overline{Q}$ output terminal 1124. The DB input terminal 1106 is electrically connected to the Q output terminal 1122. The Q output terminal 1108 is electrically connected to the DA input terminal 1118. The $\overline{Q}$ output terminal 1110 is electrically connected to the DB input terminal 1120. The SA input terminal 1112 is electrically connected to the SA input terminal 1126 for receiving a synchronization enable signal. The CP input terminal 1114 is electrically connected an FIN1 clock signal. The CP input terminal 1128 is electrically connected an FIN2 clock signal. The FIN2 clock signal is the inverted version (logical opposite) of the FIN1 clock signal, and vice versa.

The synchronization enable signal causes D-type flip flop 1102 and D-type flip flop 1116 to reset to the same states on Q terminal 1108 and Q output terminal 1122, as well as $\overline{Q}$ output terminal 1110 and $\overline{Q}$ output terminal 1124. The differential input clock signals FIN1 and FIN2 cause D-type flip flops 1102, 1116 to begin storing digital 0s and 1s, corresponding to logical low and high, respectively. The Q terminal 1108 and the $\overline{Q}$ output terminal 1110 provide a differential local clock signal. Similarly, the Q terminal 1122 and the $\overline{Q}$ out terminal 1124 provide an inverted differential local clock signal as compared to Q terminal 1108 and the $\overline{Q}$ output terminal 1110.

The frequency of a local clock signal at terminals Q 1108, 1122 is divided from the frequency of the FIN1 and FIN2 clock signals by a predetermined ratio to produce a differential local clock signal at Q output terminal 1108 with $\overline{Q}$ output terminal 1110 and Q output terminal 1122 with $\overline{Q}$ output terminal 1124. The DIV 1100 is particularly well adapted for low frequency, low power operations. In some embodiments, DIV 800 is adapted to higher frequency applications than DIV 900, DIV 900 is adapted to higher frequency applications than DIV 1000, and DIV 1000 is adapted to higher frequency applications than DIV 1100.

One aspect of this description relates to an integrated circuit die stack. The integrated circuit die stack includes a first die having a first phase locked loop (PLL), the first PLL having a first voltage controlled oscillator (VCO). The integrated circuit die stack also includes a second die having a second PLL, the second PLL having a second VCO, wherein the first die is stacked above or below the second die, and the first PLL and the second PLL share a loop filter and a frequency divider.

Another aspect of this description relates to an integrated circuit die stack. The integrated circuit die stack includes a first die including a shared phase frequency detector (PFD), a shared charge pump (CP), and a first voltage controlled oscillator (VCO). The integrated circuit die stack also includes a second die having a second voltage controlled oscillator (VCO). The integrated circuit die stack further includes a shared frequency divider (DIV) and a shared loop filter, wherein the first die and the second die are electrically switchably connected to each other. The first die in combination with the shared DIV and the shared LF to form a first phase locked loop (PLL). The second die in combination with the shared PFD, the shared CP, the shared DIV and the shared LF to form a second PLL.

Still another aspect of this description relates to an integrated circuit die stack. The integrated circuit die stack includes a phase frequency detector (PFD), a charge pump (CP), and a loop filter (LF), a frequency divider (DIV). The integrated circuit die stack also includes a first die having a first voltage controlled oscillator (VCO) having a frequency, a second die having a second VCO having a frequency different than the frequency of first VCO, and a third die having a third VCO having a frequency different than the frequency of the first VCO and the frequency of the second VCO. The first die and the second die and the third die are electrically connected to each other and switchably share the phase frequency detector (PFD), the charge pump (CP), the loop filter (LF) and the frequency divider (DIV).

What is claimed is:

1. An integrated circuit die stack, comprising:
   a first die having a first phase locked loop (PLL), the first PLL having a first voltage controlled oscillator (VCO); and
   a second die having a second PLL, the second PLL having a second VCO; wherein the first die is stacked above or below the second die, and the first PLL and the second PLL share a loop filter and a frequency divider.

2. The integrated circuit die stack of claim 1, wherein the loop filter is on an interposer, the interposer stacked with the first die and the second die.

3. The integrated circuit die stack of claim 1, wherein the frequency divider is on a third die, the third die being different than the first die or the second die, the third die stacked with the first die and the second die.

4. The integrated circuit die stack of claim 1, wherein the frequency divider has one or more differential output clock nodes or terminals.

5. The integrated circuit die stack of claim 1, wherein the frequency divider is a current mode logic frequency divider.

6. The integrated circuit die stack of claim 1, wherein the frequency divider is an injection locking frequency divider.

7. The integrated circuit die stack of claim 1, wherein the frequency divider is a single phase clock frequency divider.

8. The integrated circuit die stack of claim 1, wherein the frequency divider is a digital frequency divider.

9. The integrated circuit die stack of claim 1, wherein the loop filter comprises a plurality of capacitors, and wherein the plurality of capacitors are formed by Metal-Insulator-Metal (MIM) capacitors and/or Metal-Oxide-Metal (MOM) capacitors.

10. An integrated circuit die stack, comprising:
a first die comprising a shared phase frequency detector (PFD), a shared charge pump (CP) and a first voltage controlled oscillator (VCO);
a second die comprising a second VCO;
a shared frequency divider (DIV); and
a shared loop filter (LF),
wherein
the first die and the second die are electrically, switchably connected to each other;
the first die in combination with the shared DIV, and the shared LF to form a first phase locked loop (PLL); and
the second die in combination with the shared PFD, the shared CP, the shared DIV and the shared LF to form a second PLL.

11. The integrated circuit die stack of claim 10, wherein the frequency divider is a current mode logic frequency divider.

12. The integrated circuit die stack of claim 10, wherein the frequency divider is an injection locking frequency divider.

13. The integrated circuit die stack of claim 10, wherein the frequency divider is a single phase clock frequency divider.

14. The integrated circuit die stack of claim 10, wherein the frequency divider is a digital frequency divider.

15. An integrated circuit die stack, comprising:
a phase frequency detector (PFD);
a charge pump (CP);
a loop filter (LF);
a frequency divider (DIV);
a first die comprising a first voltage controlled oscillator (VCO) having a frequency;
a second die comprising a second VCO having a frequency different than the frequency of first VCO; and
a third die comprising a third VCO having a frequency different than the frequency of the first VCO and the frequency of the second VCO,
wherein
the first die and the second die and the third die are electrically connected to each other and switchably share the phase frequency detector (PFD), the charge pump (CP), the loop filter (LF) and the frequency divider (DIV).

16. The integrated circuit die stack of claim 15, wherein the frequency divider is a current mode logic frequency divider.

17. The integrated circuit die stack of claim 15, wherein the frequency divider is an injection locking frequency divider.

18. The integrated circuit die stack of claim 15, wherein the frequency divider is a single phase clock frequency divider.

19. The integrated circuit die stack of claim 15, wherein the frequency divider is a digital frequency divider.

20. The integrated circuit die stack of claim 15, wherein the first VCO has a frequency greater than a frequency of the second VCO and the frequency of the second VCO is greater than a frequency the third VCO.

* * * * *